(12) United States Patent
Kim et al.

(10) Patent No.: US 10,008,589 B2
(45) Date of Patent: Jun. 26, 2018

(54) OXIDE THIN FILM TRANSISTOR AND METHOD OF FABRICATING THE SAME

(71) Applicant: INDUSTRY-ACADEMIC COOPERATION FOUNDATION, YONSEI UNIVERSITY, Seoul (KR)

(72) Inventors: Hyun Jae Kim, Seoul (KR); Jeong Woo Park, Seoul (KR); Young Jun Tak, Seoul (KR); Tae Soo Jung, Seoul (KR); Heesoo Lee, Seoul (KR); Won-Gi Kim, Goyang-si (KR); Jusung Chung, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days. days.

(21) Appl. No.: 15/415,102

(22) Filed: Jan. 25, 2017

(65) Prior Publication Data

US 2017/0222027 A1    Aug. 3, 2017

(30) Foreign Application Priority Data

Feb. 1, 2016    (KR) .................. 10-2016-0012152

(51) Int. Cl.
*H01L 29/786* (2006.01)
*H01L 29/66* (2006.01)
*H01L 29/24* (2006.01)

(52) U.S. Cl.
CPC ........ *H01L 29/66969* (2013.01); *H01L 29/24* (2013.01); *H01L 29/66742* (2013.01); *H01L 29/7869* (2013.01); *H01L 29/78603* (2013.01)

(58) Field of Classification Search
None
See application file for complete search history.

(56) References Cited

FOREIGN PATENT DOCUMENTS

| CN | 103000530 B | 5/2015 | |
|---|---|---|---|
| KR | 10-2003-0083099 A | 10/2003 | |
| KR | 20030083099 A1 * | 10/2003 | ........... H01L 21/324 |

(Continued)

OTHER PUBLICATIONS

K. Kim "Low temperature and solution-processed Na-doped zinc oxide transparent thin film transistors with reliable electrical performance using methanol developing and surface engineering" J. Mater. Chem 22 published Sep. 14, 2012 pp. 23120-23128.*

(Continued)

*Primary Examiner* — Asok K Sarkar
*Assistant Examiner* — Grant Withers
(74) *Attorney, Agent, or Firm* — Sughrue Mion, PLLC (57) ABSTRACT

Disclosed are an oxide thin film transistor and a method of fabricating the same. The oxide thin film transistor according to an embodiment of the present disclosure includes a gate electrode formed on a substrate, a gate insulating layer formed on the gate electrode, an oxide semiconductor layer as a semiconductor active layer, and source and drain electrodes formed on the oxide semiconductor layer. The oxide semiconductor layer is activated by heat of less than 300° C. and a change in the magnetic flux of an applied magnetic field. More specifically, the activation proceeds by activation energy provided by Joule heat generated from eddy current occurring in the oxide semiconductor layer by a change in the magnetic flux, and the heat of less than 300° C.

9 Claims, 9 Drawing Sheets

(56) References Cited

FOREIGN PATENT DOCUMENTS

| KR | 10-2010-0006519 A | 1/2010 | |
|----|-------------------|--------|---|
| KR | 10-0936487 B1 | 1/2010 | |
| KR | 10-2011-0064284 A | 6/2011 | |
| KR | 10-2011-0101058 A | 9/2011 | |
| KR | 20150005598 A1 * | 1/2014 | ......... H01L 29/7869 |
| KR | 10-2014-0074861 A | 6/2014 | |
| KR | 10-2015-0005598 A | 1/2015 | |

OTHER PUBLICATIONS

Cheng-Jyun Wang et al., "Facile Oxygen-Plasma Approach for Depositing Silicon/Nitride Oxide on Transparent, Flexible Zinc-Oxide Thin Film Transistors", AM-FPD '14, P-11, pp. 109-112.

Communication dated May 18, 2017 issued by the Korean Intellectual Property Office in corresponding Korean Patent Application No. 10-2016-0012152.

Communication dated Feb. 7, 2018, issued by the Korean Patent Office in counterpart Korean Patent Application No. 10-2016-0012152.

* cited by examiner

OXIDE THIN FILM TRANSISTOR AND METHOD OF FABRICATING THE SAME

CROSS-REFERENCE TO RELATED APPLICATION

This application claims the priority benefit of Korean Patent Application No. 10-2016-0012152, filed on Feb. 1, 2016 in the Korean Intellectual Property Office, the disclosure of which is incorporated herein by reference.

BACKGROUND OF THE DISCLOSURE

Field of the Disclosure

The present disclosure relates to an oxide thin film transistor and a method of fabricating the same, and more particularly, to a high-performance oxide thin film transistor including an oxide semiconductor layer formed under a low-temperature environment, and a method of fabricating the same.

Description of the Related Art

Recently, use of an oxide semiconductor as the semiconductor layer of a thin film transistor has been studied. For example, an amorphous oxide semiconductor mainly composed of InGaZnO (IGZO) has been evaluated as a stable material. When the oxide semiconductor is used in fabrication of a thin film transistor, existing equipment can be used, eliminating the need to purchase additional equipment. For these reasons, a thin film transistor using the oxide semiconductor is attracting attention as a next generation transistor.

In recent years, devices requiring flexibility, such as flexible displays and wearable devices, have been developed. Accordingly, oxide thin film transistors are fabricated using flexible substrates to apply oxide thin film transistors to flexible devices.

However, when an oxide thin film transistor is fabricated using a flexible substrate, the flexible substrate may be damaged due to high temperature, and the performance of the transistor may be degraded.

RELATED DOCUMENTS

Patent Document

Korea Patent Publication No. 10-2011-0101058, "METAL OXIDE THIN FILM AND METHOD OF PREPARING THE SAME, SOLUTION FOR METAL OXIDE THIN FILM"

Korea Patent Publication No. 10-2011-0064284, "METHOD OF FABRICATING THIN FILM TRANSISTOR"

Non-Patent Document

FACILE OXYGEN-PLASMA APPROACH FOR DEPOSITING SILICON/NITRIDE OXIDE ON TRANSPARENT, FLEXIBLE ZINC-OXIDE THIN FILM TRANSISTORS, Cheng-Jyun Wang, Hsin-Chiang You, Yu-Hsien Lin.

SUMMARY OF THE DISCLOSURE

Therefore, the present disclosure has been made in view of the above problems, and it is an object of the present disclosure to provide a high-performance oxide thin film transistor including an oxide semiconductor layer formed using a magnetic field under a low-temperature environment, and a method of fabricating the same.

In accordance with the present disclosure, the above and other objects can be accomplished by the provision of an oxide thin film transistor, including a gate electrode formed on a substrate, a gate insulating layer formed on the gate electrode, an oxide semiconductor layer as a semiconductor active layer, and source and drain electrodes formed on the oxide semiconductor layer, wherein the oxide semiconductor layer is activated by heat of less than 300° C. and a change in the magnetic flux of an applied magnetic field, and the activation proceeds by activation energy provided by Joule heat generated from eddy current occurring in the oxide semiconductor layer by a change in the magnetic flux, and the heat of less than 300° C.

The oxide semiconductor layer may be formed by placing the substrate on which an oxide is deposited on the gate insulating layer on a hot plate and heating the oxide to a temperature of 150° C. or more and less than 300° C. while applying a rotating magnetic field in the range of 0 to 1200 rpm to the oxide.

In addition, the activation may proceed by applying the heat and the magnetic field for 30 minutes to 2 hours.

The strength of the magnetic field may be 1 to 10 mT.

The oxide may be deposited by any one of sputtering, chemical vapor deposition (CVD), atomic layer deposition (ALD) and solution processes.

In addition, the oxide may include any one of amorphous indium-gallium-zinc oxide (a-IGZO), zinc oxide (ZnO), indium zinc oxide (IZO), indium tin oxide (ITO), zinc tin oxide (ZTO), gallium zinc oxide (GZO), hafnium-indium-zinc oxide (HIZO), zinc-indium-tin oxide (ZITO) and aluminum-zinc-tin oxide (AZTO).

The substrate may be any one flexible substrate of polyimide (PI), polycarbonate (PC), polyethersulfone (PES), polyethylene terephthalate (PET), polyethylene naphthalate (PEN), polyarylate (PAR) and glass-fiber reinforced plastic (GFRP).

In accordance with an aspect of the present disclosure, the above and other objects can be accomplished by the provision of a method of fabricating an oxide thin film transistor, the method including a step of forming a gate electrode on a substrate, a step of forming a gate insulating layer on the gate electrode, a step of forming an oxide semiconductor layer on the gate insulating layer and a step of forming source and drain electrodes on the oxide semiconductor layer, wherein the step of forming the oxide semiconductor layer is performed by depositing an oxide on the gate insulating layer and heating the oxide to a temperature of less than 300° C. while applying a magnetic field to the oxide.

In the step of forming the oxide semiconductor layer, the oxide deposited on the gate insulating layer may be subjected to patterning.

In the step of forming the oxide semiconductor layer, the substrate on which the oxide is deposited may be placed on a hot plate and a rotating magnetic field in the range of 0 to 1200 rpm may be applied to the oxide while heating to a temperature of 150° C. or more and less than 300° C.

In the step of forming the oxide semiconductor layer, the heat and the magnetic field may be applied for 30 minutes to 2 hours.

In the step of forming the oxide semiconductor layer, the magnetic field may be applied at a strength of 1 to 10 mT.

The oxide may be deposited by any one of sputtering, chemical vapor deposition (CVD), atomic layer deposition (ALD) and solution processes.

The oxide may be any one of amorphous indium-gallium-zinc oxide (a-IGZO), zinc oxide (ZnO), indium zinc oxide (IZO), indium tin oxide (ITO), zinc tin oxide (ZTO), gallium zinc oxide (GZO), hafnium-indium-zinc oxide (HIZO), zinc-indium-tin oxide (ZITO) and aluminum-zinc-tin oxide (AZTO).

The substrate may be any one flexible substrate of polyimide (PI), polycarbonate (PC), polyethersulfone (PES), polyethylene terephthalate (PET), polyethylene naphthalate (PEN), polyarylate (PAR) and glass-fiber reinforced plastic (GFRP).

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

The embodiments of the present disclosure are described with reference to the accompanying drawings and the description thereof but are not limited thereto.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

FIGS. 1A to 1D are drawings illustrating a method of fabricating an oxide thin film transistor according to an example of the present disclosure.

Figure 1A:
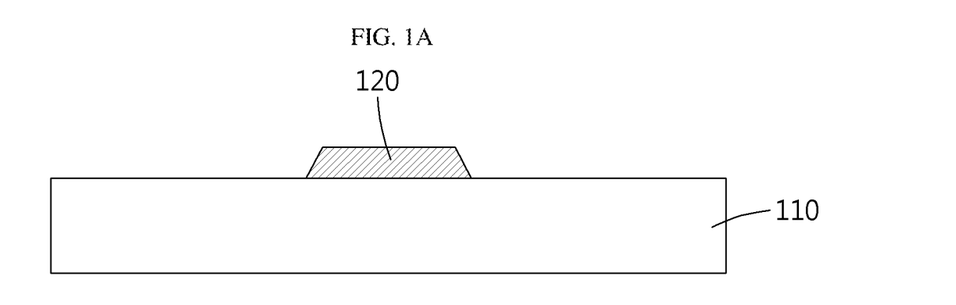
FIGS. 1A to 1D are drawings illustrating a method of fabricating an oxide thin film transistor according to an example of the present disclosure.

As shown in FIG. 1A, first, a gate electrode 120 is formed on a substrate 110 to fabricate an oxide thin film transistor. In this example, the substrate 110 is preferably a plastic-like flexible substrate, such as polyimide (PI), polycarbonate (PC), polyethersulfone (PES), polyethylene terephthalate (PET), polyethylene naphthalate (PEN), polyarylate (PAR) and glass-fiber reinforced plastic (GFRP), but may also be a glass or quartz substrate. In addition to these substrates, other types of substrates may be used as long as the substrates are usable under a low-temperature environment.

The gate electrode 120 may be formed by depositing a metal substance, such as molybdenum (Mo) or aluminum (Al), on the substrate 110 and patterning the same. Alternatively, a p$^+$-Si wafer may be used as the gate electrode 120.

Figure 1B:
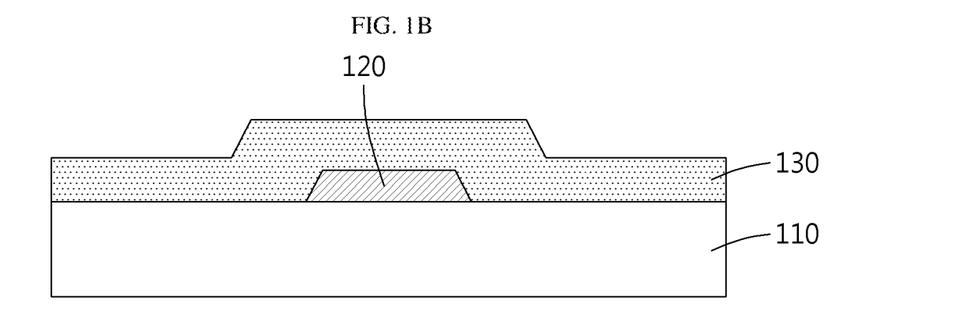

As shown in FIG. 1B, an oxide or nitride is deposited on the substrate 110 and the gate electrode 120 to form a gate insulating layer 130. For example, the gate insulating layer 130 may be formed by depositing silicon oxide ($SiO_2$) to a thickness of about 120 nm using a dry oxidation method.

Figure 1C:
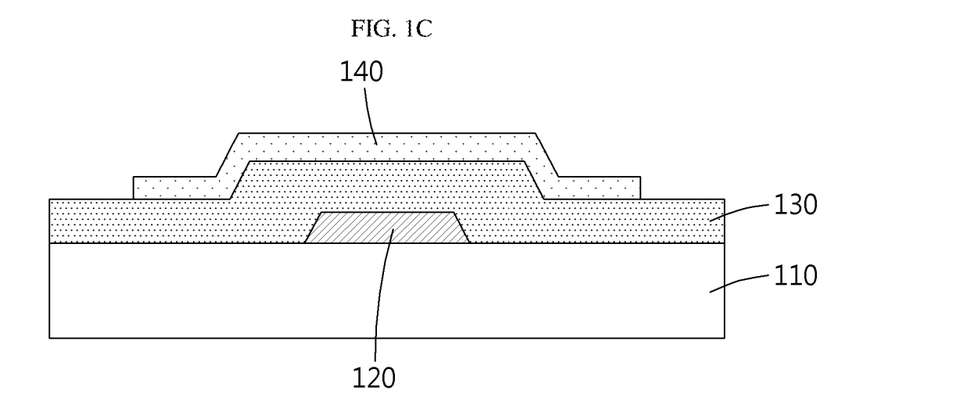

Next, as shown in FIG. 1C, an oxide semiconductor layer 140 is formed on the gate insulating layer 130. First, an oxide is deposited on the gate insulating layer 130 to form the oxide semiconductor layer 140.

Here, the oxide may be any one of amorphous indium-gallium-zinc oxide (a-IGZO), zinc oxide (ZnO), indium zinc oxide (IZO), indium tin oxide (ITO), zinc tin oxide (ZTO), gallium zinc oxide (GZO), hafnium-indium-zinc oxide (HIZO), zinc-indium-tin oxide (ZITO) and aluminum-zinc-tin oxide (AZTO), without being limited thereto.

In addition, the oxide may be deposited by any one of a sputtering process, a chemical vapor deposition (CVD) process, an atomic layer deposition (ALD) process and a solution process.

After deposition, a magnetic field is applied to the oxide at 300° C. or less to form the oxide semiconductor layer 140.

Figure 2:
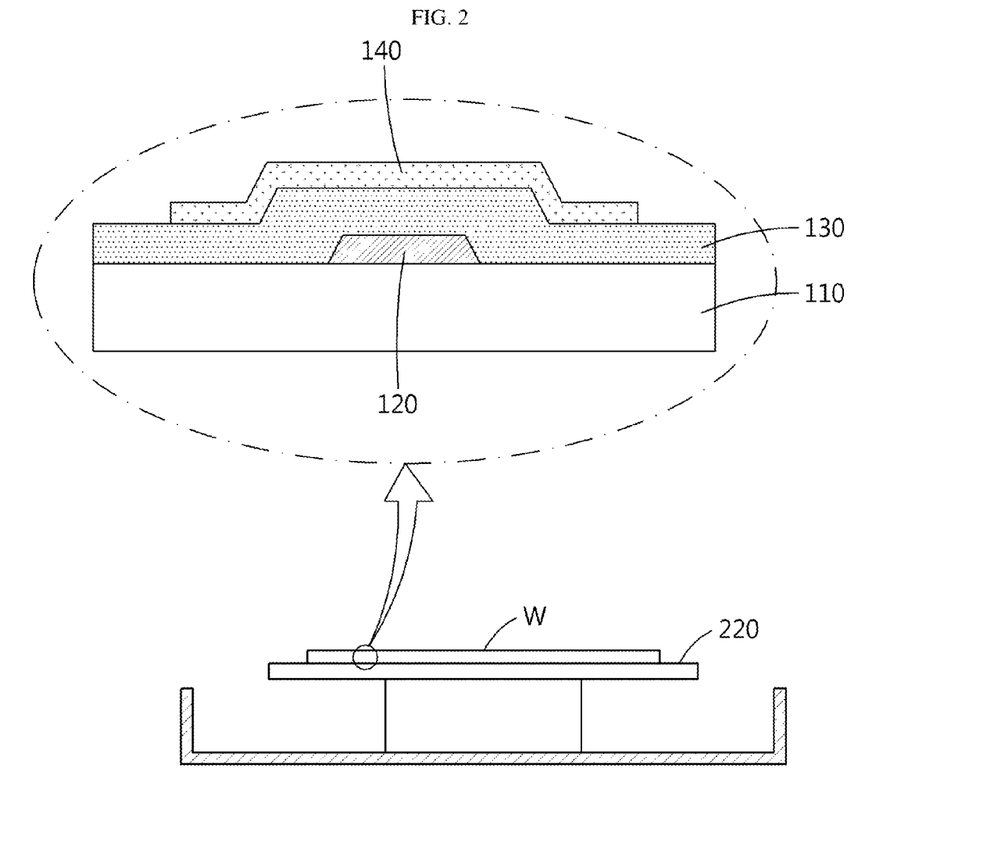
FIG. 2 is a drawing illustrating a method of forming an oxide semiconductor layer using a hot plate.

Next, as illustrated in FIG. 2, the substrate 110 on which an oxide has been deposited is placed on a hot plate 220. In an actual process, a wafer (W) on which a plurality of structures formed of unit elements shown in FIG. 1C is formed may be placed on the hot plate 220.

According to an embodiment, the hot plate 220 is heated to less than 300° C. and the temperature is transferred to an oxide while a magnetic field generated by a magnet (not shown) provided on the hot plate 220 is applied to the oxide. Here, the magnetic field may be a static magnetic field. In addition, the magnetic field may be applied at a strength of 1 to 10 mT.

When applying the above-described process conditions, an oxide may be activated even under a low-temperature environment of less than 300° C. to form the oxide semiconductor layer 140 having high performance. Preferably, by heating the hot plate 220 to a low temperature of about 150° C. and applying a static magnetic field thereto at the same time, it is possible to prevent the substrate 110 from being damaged when the oxide semiconductor layer 140 is formed.

According to another embodiment, an oxide may be heated to a temperature of 150° C. and, at the same time, a rotating magnetic field in the range of 0 to 1200 rpm may be applied thereto. Preferably, a rotating magnetic field in the range of 800 to 1200 rpm may be applied.

The oxide semiconductor layer 140 is activated by heat of less than 300° C. and a change in the magnetic flux of an applied magnetic field. More specifically, the activation proceeds by activation energy provided by Joule heat generated from eddy current occurring in the oxide semiconductor layer 140 by a change in the magnetic flux, and the heat of less than 300° C.

In the above embodiments, energy is needed to activate the oxide in order to induce chemical bonding in the state where the oxide is physically bonded on the gate insulating layer 130.

Conventionally, energy provided by heating an oxide semiconductor layer to a temperature of 300° C. or more is used to activate an oxide. When a high temperature of 300° C. or more is applied, an oxide semiconductor layer can be activated, but other layers or a substrate constituting an oxide thin film transistor can be damaged by the high temperature. In particular, when the substrate 110 is a flexible substrate, since the melting points of flexible substrates are low, the substrate 110 may be damaged by a high temperature.

Therefore, when an oxide semiconductor layer is formed under a high-temperature environment, an additional process or a protective layer is required to prevent damage due to a high temperature, which may increase the fabricating cost of an oxide thin film transistor.

On the other hand, according to the above embodiments, since a temperature of less than 300° C. is applied to an oxide and, at the same time, a magnetic field is applied to the same, energy required for inducing chemical bonding may be sufficiently transferred to the oxide even by low-temperature heat treatment.

For example, magnetic flux changes due to a change in a magnetic field including a static magnetic field and a dynamic magnetic field (e.g., rotating magnetic field), and electromagnetic induction occurs in a metal atom (e.g., in the case of IGZO, In, Ga and Zn) and electrons in an oxide semiconductor layer. Thereafter, eddy current is generated by the electromagnetic induction, and Joule heat is applied to the oxide semiconductor layer. At this time, the Joule heat acts as energy required for activation, which helps chemical bonding between a metal and oxygen. Thus, through this process, a chemically stabilized oxide semiconductor layer may be formed even under a low-temperature environment.

Therefore, according to embodiments of the present disclosure, since heat treatment is performed at a low temperature, the substrate may not be damaged even when the substrate is a flexible substrate. In addition, a high-performance oxide thin film transistor may be fabricated using a simple process and at low cost.

Additionally, according to an embodiment described above, it was described that a temperature of less than 300° C. is applied when the oxide semiconductor layer 140 is fabricated. However, the lower limit of heat-treatment temperature may be suitably selected by those skilled in the art within a range in which the performance of an oxide thin film transistor is not deteriorated. For example, the heat-treatment temperature of the oxide semiconductor layer 140 may be 150° C. or more and less than 300° C.

In addition, it is preferable that the process of simultaneously applying low temperature and a magnetic field is performed within a range of 30 minutes to 2 hours. Process time may be determined within the time range depending on the thickness of an oxide, the temperature and the magnetic field described above.

In addition, in this process, the oxide semiconductor layer 140 including channel, source and drain regions may be formed by patterning the oxide. Specifically, the oxide semiconductor layer 140 shown in FIG. 1C may be formed by exposing the oxide using a mask pattern and etching the same.

Figure 1D:
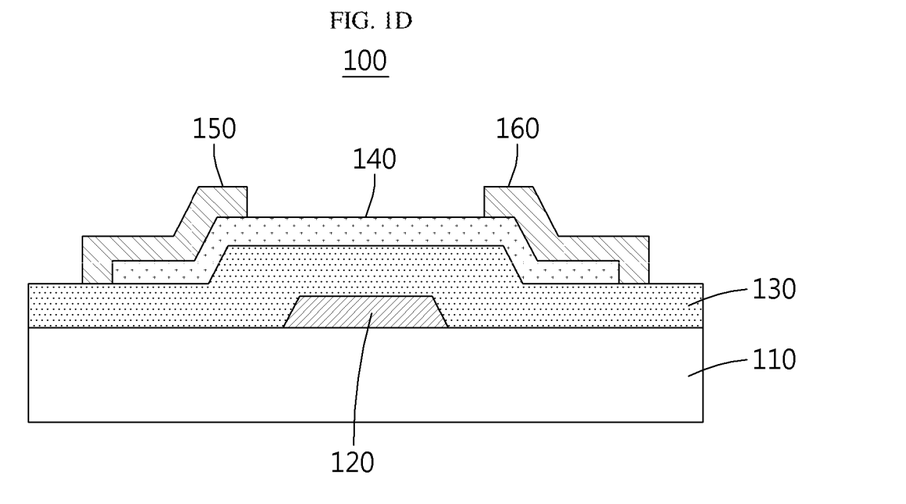

As shown in FIG. 1D, source and drain electrodes 150 and 160 may be formed on the oxide semiconductor layer 140. Here, the source and drain electrodes 150 and 160 may be formed by depositing a metal substance on the oxide semiconductor layer 140 and patterning the same, and the metal substance may be molybdenum (Mo) or aluminum (Al).

An oxide thin film transistor 100 fabricated by a method shown in FIGS. 1A to 1D has a high performance, including the oxide semiconductor layer 140 formed by a magnetic field under a low-temperature environment.

Figure 3:
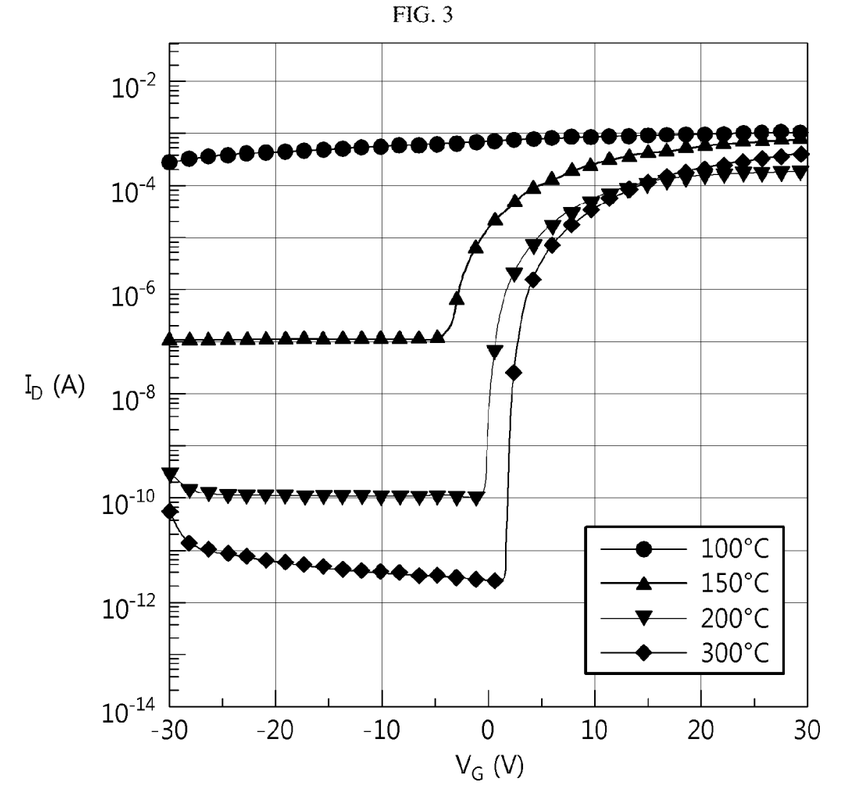
FIGS. 3 to 6 are graphs showing the transfer characteristic of an oxide thin film transistor fabricated according to examples of the present disclosure.

FIG. 3 is a graph showing the transfer characteristics of oxide thin film transistors fabricated by a general method. An oxide thin film transistor was fabricated by heating an oxide semiconductor layer to a temperature of 100, 150, 200 or 300° C. without a magnetic field (static magnetic field or rotating magnetic field), and the transfer characteristics of these four oxide thin film transistors are shown in FIG. 3.

Drain voltage ($V_D$) was fixed to a constant value, and the transfer characteristics of the four oxide thin film transistors fabricated according to a conventional process were measured while changing gate voltage ($V_G$) from −30 to 30 V.

Referring to FIG. 3, among the four transistors, an oxide thin film transistor heat treated at a temperature of 300° C. exhibits the best transfer characteristic, indicating that heat treatment at 300° C. or more is required in forming an oxide semiconductor layer.

Figure 4:
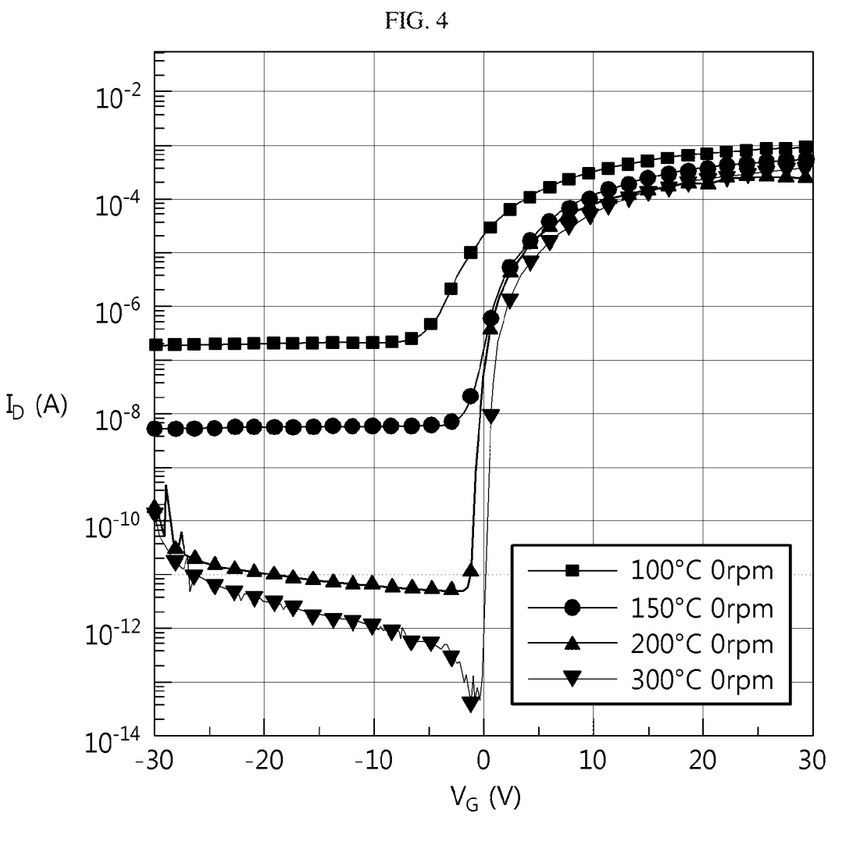
Figure 5:
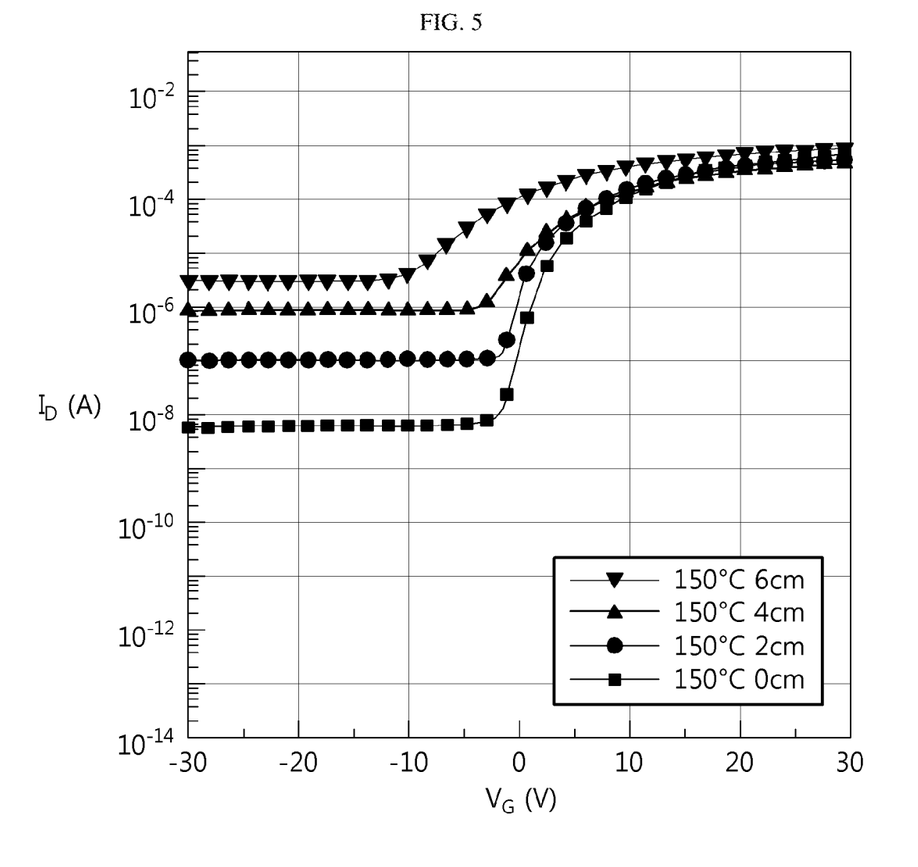
Figure 6:
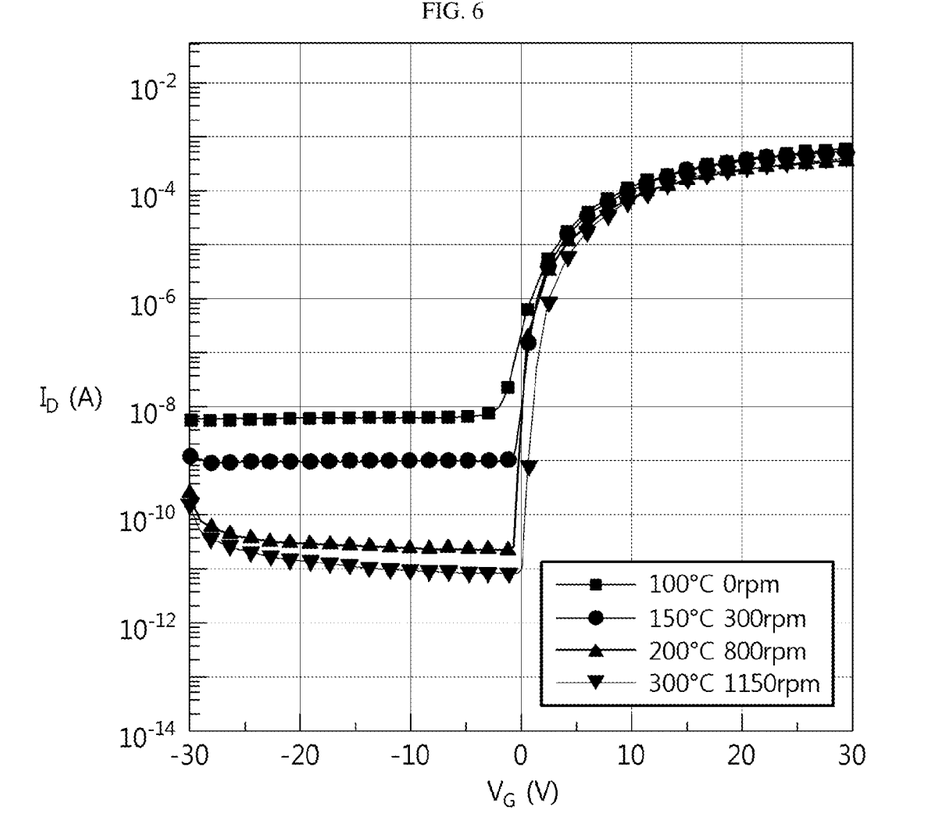

FIGS. 4 to 6 are graphs showing the transfer characteristics of oxide thin film transistors fabricated according to examples of the present disclosure. Specifically, in FIGS. 4 to 6, the fabrication process of the oxide thin film transistors was the same as that shown in FIGS. 1A to 1D, except that process variables such as heat-treatment temperature, magnetic field strength and the rotation speed of a magnetic field were different. Here, when the oxide semiconductor layer of each oxide thin film transistor is formed, amorphous indium-gallium-zinc oxide (IGZO) having a composition ratio of In:Ga:Zn of 1:1:1 was used, and the oxide semiconductor layer of 40 nm thickness was deposited by a RF magnetron sputtering method in a 5 mTorr argon atmosphere with a power of 150 W for 5 minutes.

FIG. 4 is a graph showing the transfer characteristics of four oxide thin film transistors fabricated by applying a static magnetic field while heat treating the oxide semiconductor layers deposited by the above-described method at temperatures of 100, 150, 200 and 300° C., respectively.

Referring to FIG. 4, it can be seen that an oxide thin film transistor heat-treated at a high temperature has high transfer characteristic. In addition, when comparing the oxide thin film transistors heat-treated at the same temperature in FIGS. 3 and 4, the oxide thin film transistor applied with a static magnetic field shown in FIG. 4 exhibited more improved transfer characteristic.

For example, as compared with an oxide thin film transistor shown in FIG. 3, which was heat treated at a temperature of 200° C. without a static magnetic field, an oxide thin film transistor shown in FIG. 4, which was heat treated at a temperature of 200° C. in the presence of a static magnetic field, exhibited more improved transfer characteristic. In particular, the transfer characteristic of an oxide thin film transistor subjected to heat treatment at 200° C. and a static magnetic field was similar to that of an oxide thin film transistor subjected to heat treatment at 300° C. without a static magnetic field. That is, it can be seen that channel characteristics are improved as a static magnetic field is applied to an oxide semiconductor layer with low temperature, and that the electric characteristics of the oxide thin film transistor are also improved as the channel characteristics are improved.

FIG. 5 is a graph showing the transfer characteristics of four oxide thin film transistors depending on the distance between an oxide semiconductor layer and a hot plate. When these oxide thin film transistors were fabricated, an oxide semiconductor layer deposited by the above-described method was heat treated at a temperature of 150° C. and, at the same time, a static magnetic field was applied to the same. At this time, the process was performed while changing the distance between the oxide semiconductor layer and a hot plate to 6, 4, 2 or 0 cm. Here, the distance could be changed by separating the oxide semiconductor layer from the hot plate. In this case, a thermally conductive object was placed in the separated space so as to transfer heat generated from the hot plate to the oxide semiconductor.

During the process, since the hot plate maintains a constant value of a static magnetic field, when the oxide semiconductor layer is separated from the hot plate, the strength of a static magnetic field gradually becomes weak.

Referring to FIG. 5, it can be seen that as an oxide semiconductor layer is closer to a hot plate, that is, as the strength of a static magnetic field applied to the oxide layer increases, an oxide thin film transistor has improved transfer characteristic.

FIG. 6 is a graph showing the transfer characteristics of four oxide thin film transistors depending on the rotational speed of a rotating magnetic field. When these oxide thin film transistors were fabricated, an oxide semiconductor layer deposited by the above-described method was heat treated at a temperature of 150° C. and, at the same time, a static magnetic field was applied to the same. At this time, the above process was performed at different rotational speeds of a rotating magnetic field (0, 300, 800, 1150 rpm). Here, the rotational speed of a rotating magnetic field is determined by the rotational speed of a magnet included in the hot plate.

Referring to FIG. 6, it can be seen that as the rotational speed of a rotating magnetic field increases, an oxide thin film transistor has improved transfer characteristic. That is, an oxide thin film transistor to which a rotating magnetic field of 800 rpm or 1150 rpm is applied has better transfer characteristic than an oxide thin film transistor to which a rotating magnetic field of 300 rpm is applied.

In addition, in the case of oxide thin film transistors to which respective rotating magnetic fields of 800 and 1150 rpm were applied, there was no significant difference in transfer characteristic thereof. These data indicate that, when a rotating magnetic field is applied within the range of 800 and 1200 rpm, the transfer characteristic of an oxide thin film transistor is improved under a low-temperature environment, and further rotational speed does not significantly affect the transfer characteristic.

Figure 7A:
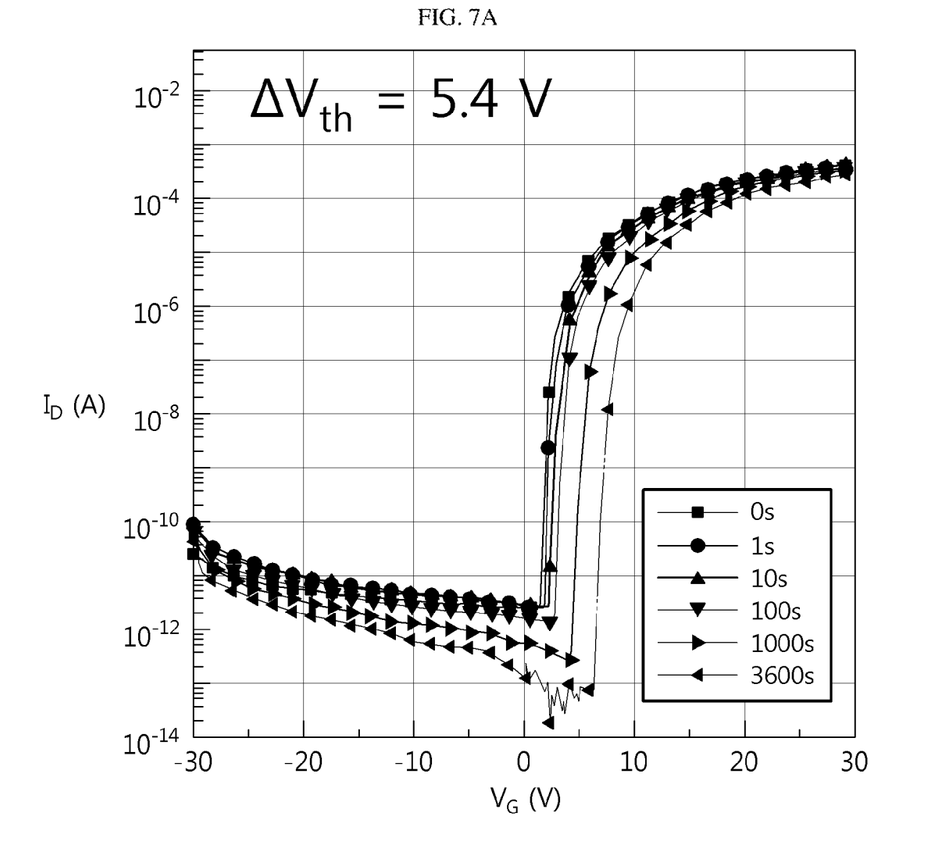
FIGS. 7A and 7B are graphs showing positive bias stress (PBS) tests for an oxide thin film transistor fabricated according to a comparative example and an example of the present disclosure, respectively.

FIG. 7A is a positive bias stress (PBS) test graph for an oxide thin film transistor according to a comparative example. When the oxide thin film transistor according to a comparative example is fabricated, an oxide semiconductor layer was subjected to heat treatment at a temperature of 300° C. without a magnetic field (static magnetic field or rotating magnetic field).

Figure 7B:
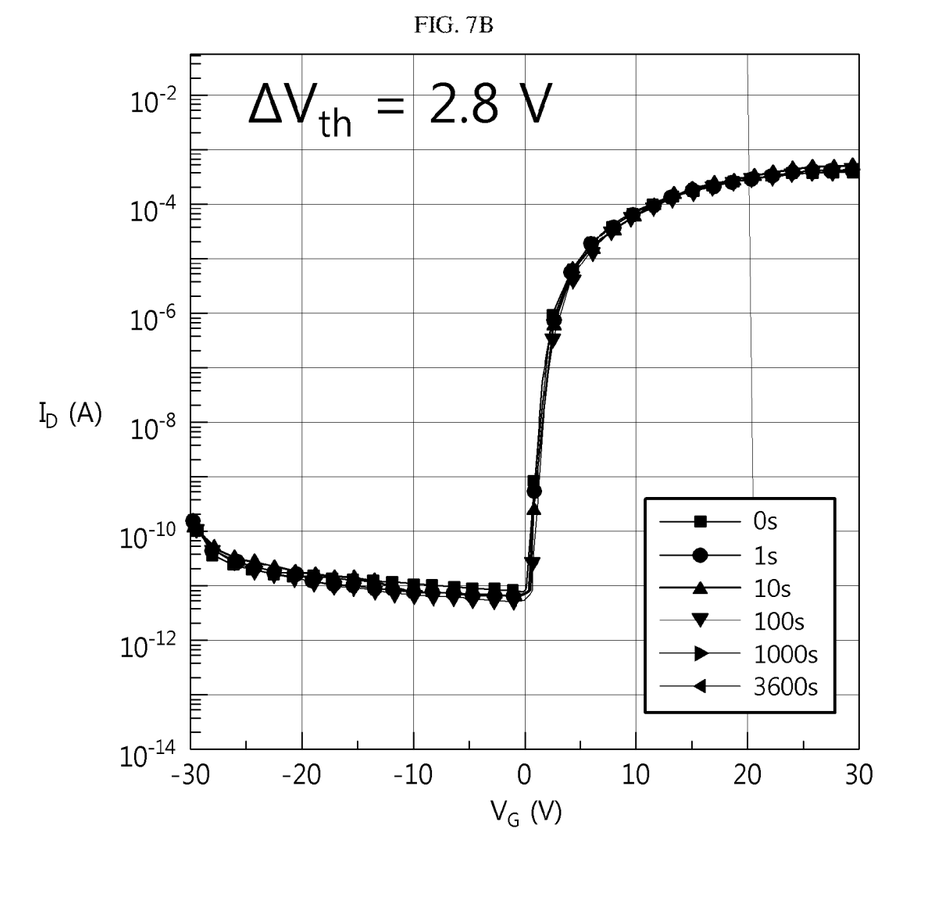

FIG. 7B is a PBS test graph for an oxide thin film transistor according to an example. When the oxide thin film transistor according to an example was fabricated, an oxide semiconductor layer was heat treated at a temperature of 150° C. and, at the same time, a rotating magnetic field of 1150 rpm was applied to the same.

A voltage of +20 V was applied to the gate electrode of each of the comparative example and the example, and a voltage of 10.1 V was applied to the drain electrode. Then, at 0, 1, 10, 100, 1000 and 3600 seconds, change in electrical characteristics of each oxide thin film transistor was tested.

Referring to FIGS. 7A and 7B, the oxide thin film transistor according to the comparative example exhibited a threshold voltage of 5.4V, whereas the oxide thin film transistor according to the example exhibited a threshold voltage of 2.8V That is, although the oxide thin film transistor according to the example was heat treated at a lower temperature than the oxide thin film transistor according to the comparative example, the threshold voltage of the oxide thin film transistor according to the example was decreased about twice, because a rotating magnetic field of 1150 rpm was applied during fabrication of an oxide semiconductor layer.

According to embodiments of the present disclosure, since an oxide semiconductor layer is formed using a magnetic field under a low-temperature environment, a high-performance oxide thin film transistor can be fabricated using a simple process and at low cost.

In particular, when the substrate is a flexible substrate when forming the oxide semiconductor layer, damage to the substrate can be reduced.

Although the present disclosure has been described through limited examples and figures, the present disclosure is not intended to be limited to the examples. Those skilled in the art will appreciate that various modifications, additions and substitutions are possible, without departing from the scope and spirit of the disclosure.

It should be understood, however, that there is no intent to limit the disclosure to the embodiments disclosed, rather, the disclosure is to cover all modifications, equivalents, and alternatives falling within the spirit and scope of the disclosure as defined by the claims.

What is claimed is:

1. An oxide thin film transistor, comprising:
a gate electrode formed on a substrate;
a gate insulating layer formed on the gate electrode;
an oxide semiconductor layer as a semiconductor active layer; and
source and drain electrodes formed on the oxide semiconductor layer,
wherein the oxide semiconductor layer is a semiconductor layer formed by activation by heat of less than 300° C. and a change in magnetic flux of an applied magnetic field, and
the activation proceeds by activation energy provided by Joule heat generated from eddy current occurring in the oxide semiconductor layer by a change in the magnetic flux, and the heat of less than 300° C., thereby inducing a chemical bonding between metal and oxygen in the oxide semiconductor layer, and
wherein the oxide semiconductor layer includes the metal and the oxygen bonded by the induced chemical bonding.

2. The oxide thin film transistor according to claim 1, wherein the oxide semiconductor layer is formed by placing the substrate on which an oxide is deposited on the gate insulating layer on a hot plate and heating the oxide to a temperature of 150° C. or more and less than 300° C. while applying a rotating magnetic field in a range of 0 to 1200 rpm to the oxide.

3. The oxide thin film transistor according to claim 2, wherein the oxide is deposited by any one of sputtering, chemical vapor deposition (CVD), atomic layer deposition (ALD) and solution processes.

4. The oxide thin film transistor according to claim 2, wherein the oxide comprises any one of amorphous indium-gallium-zinc oxide (a-IGZO), zinc oxide (ZnO), indium zinc oxide (IZO), indium tin oxide (ITO), zinc tin oxide (ZTO), gallium zinc oxide (GZO), hafnium-indium-zinc oxide (HIZO), zinc-indium-tin oxide (ZITO) and aluminum-zinc-tin oxide (AZTO).

5. The oxide thin film transistor according to claim 1, wherein the activation proceeds by applying the heat and the magnetic field for 30 minutes to 2 hours.

6. The oxide thin film transistor according to claim 1, wherein a strength of the magnetic field is 1 to 10 mT.

7. The oxide thin film transistor according to claim 1, wherein the substrate is any one flexible substrate of polyimide (PI), polycarbonate (PC), polyethersulfone (PES), polyethylene terephthalate (PET), polyethylene naphthalate (PEN), polyarylate (PAR) and glass-fiber reinforced plastic (GFRP).

8. A method of fabricating an oxide thin film transistor, the method comprising:
forming a gate electrode on a substrate;
forming a gate insulating layer on the gate electrode;
forming an oxide semiconductor layer on the gate insulating layer; and
forming source and drain electrodes on the oxide semiconductor layer,
wherein the forming of the oxide semiconductor layer is performed by depositing an oxide on the gate insulating layer and heating the oxide to a temperature of less than 300° C. while applying a magnetic field to the oxide,
wherein the oxide semiconductor layer is activated by heat of less than 300° C. and a change in magnetic flux of an applied magnetic field, and
wherein the activation proceeds by activation energy provided by Joule heat generated from eddy current occurring in the oxide semiconductor layer by a change in the magnetic flux, and the heat of less than 300° C., thereby inducing a chemical bonding between metal and oxygen in the oxide semiconductor layer.

9. The method of fabricating an oxide thin film transistor according to claim 8, wherein, in the step of forming the oxide semiconductor layer, the oxide deposited on the gate insulating layer is subjected to patterning.

* * * * *